United States Patent [19]

Rogers et al.

[11] Patent Number: 5,469,456
[45] Date of Patent: Nov. 21, 1995

[54] LASER DEVICE AND METHOD OF MANUFACTURE USING NON-METALIZED FIBER

[75] Inventors: Lesley Rogers, Los Angeles; Michael M. Ung, Ontario, both of Calif.

[73] Assignee: Opto Power Corporation, City Of Industry, Calif.

[21] Appl. No.: 220,441

[22] Filed: Mar. 31, 1994

[51] Int. Cl.⁶ .................. H01S 3/18; G02B 6/30; G02B 6/42
[52] U.S. Cl. .................. 372/43; 385/14; 385/49; 385/88; 385/91; 385/94
[58] Field of Search .................. 372/6, 36, 43; 385/49, 14, 94, 132, 128, 91, 88

[56] References Cited

U.S. PATENT DOCUMENTS

| | | | |
|---|---|---|---|
| 4,119,363 | 10/1978 | Camlibel et al. | 385/94 |
| 4,456,334 | 6/1984 | Henry et al. | 385/91 |
| 4,615,031 | 9/1986 | Eales et al. | 372/36 |
| 4,708,429 | 11/1987 | Clark et al. | 385/91 |
| 4,803,689 | 2/1989 | Shibanuma | 372/36 |
| 4,984,866 | 1/1991 | Boisgontier et al. | 385/49 |
| 4,997,253 | 3/1991 | Enochs | 385/88 |
| 5,042,895 | 8/1991 | Chouinard et al. | 385/132 |
| 5,185,835 | 2/1993 | Vial et al. | 385/14 |

*Primary Examiner*—Rodney B. Bovernick
*Assistant Examiner*—Robert McNutt
*Attorney, Agent, or Firm*—Herbert M. Shapiro

[57] ABSTRACT

A laser device includes a glass optical fiber secured in position to capture light output from the laser. The fiber is secured in position with solder directly to the glass of the fiber without any metallization of the fiber. The solder-only technique satisfies the critical requirement for preventing fiber movement over the lifetime standard for laser device with multimade lasers and multimode fibers.

11 Claims, 2 Drawing Sheets

LASER DEVICE AND METHOD OF MANUFACTURE USING NON-METALIZED FIBER

FIELD OF THE INVENTION

This invention relates to laser devices and more particularly to techniques for fixing the position of an optical fiber in such a device for capturing light generated by the laser.

BACKGROUND OF THE INVENTION

Laser devices include a laser source of light and an optical fiber for capturing the light and for transmitting the light to a position where it can be conveniently coupled into a system for practical use. A critical operation in the manufacture of a laser device is the alignment of the optical fiber with the laser for efficient coupling of the light energy into the fiber. Also, the technique for securing the fiber to the laser must ensure that no later movement of the fiber occurs once attached.

Prior art techniques for securing an optical fiber to a laser employ a metallized fiber. The metallizing process uses graphite followed by a plating step. Alternatively, a prior art process uses electroless Nickel and then an electroplating step or an evaporation step. In some instances, metallized fibers have been soldered into position.

Also, in some instances, a fiber is contained within a sleeve where the sleeve is secured to the fiber with epoxy cement and the sleeve is secured in place with solder. All of the above techniques are complicated and require significant handling which results in breakage and a reduction in yields.

BRIEF DESCRIPTION OF THE INVENTION

In accordance with the principles of the present invention, it has been found that a glass optical fiber can be secured in position by solder directly to the fiber without the necessity of matallizing the fiber and that no later movement of the fiber occurs. The direct solder-to-glass fiber technique described herein has been found to satisfy the requirements for multimode lasers where no movement of the fiber is acceptable for a one hundred thousand hour lifetime standard. Applicant is unaware of even any suggestion in the art for using solder directly to a non-metallized glass optical fiber for securing the fiber in a laser device where positioning of the fiber and position retention requirements are so critical.

DETAILED DESCRIPTION OF AN ILLUSTRATIVE EMBODIMENT OF THIS INVENTION

Figures 1, 2:
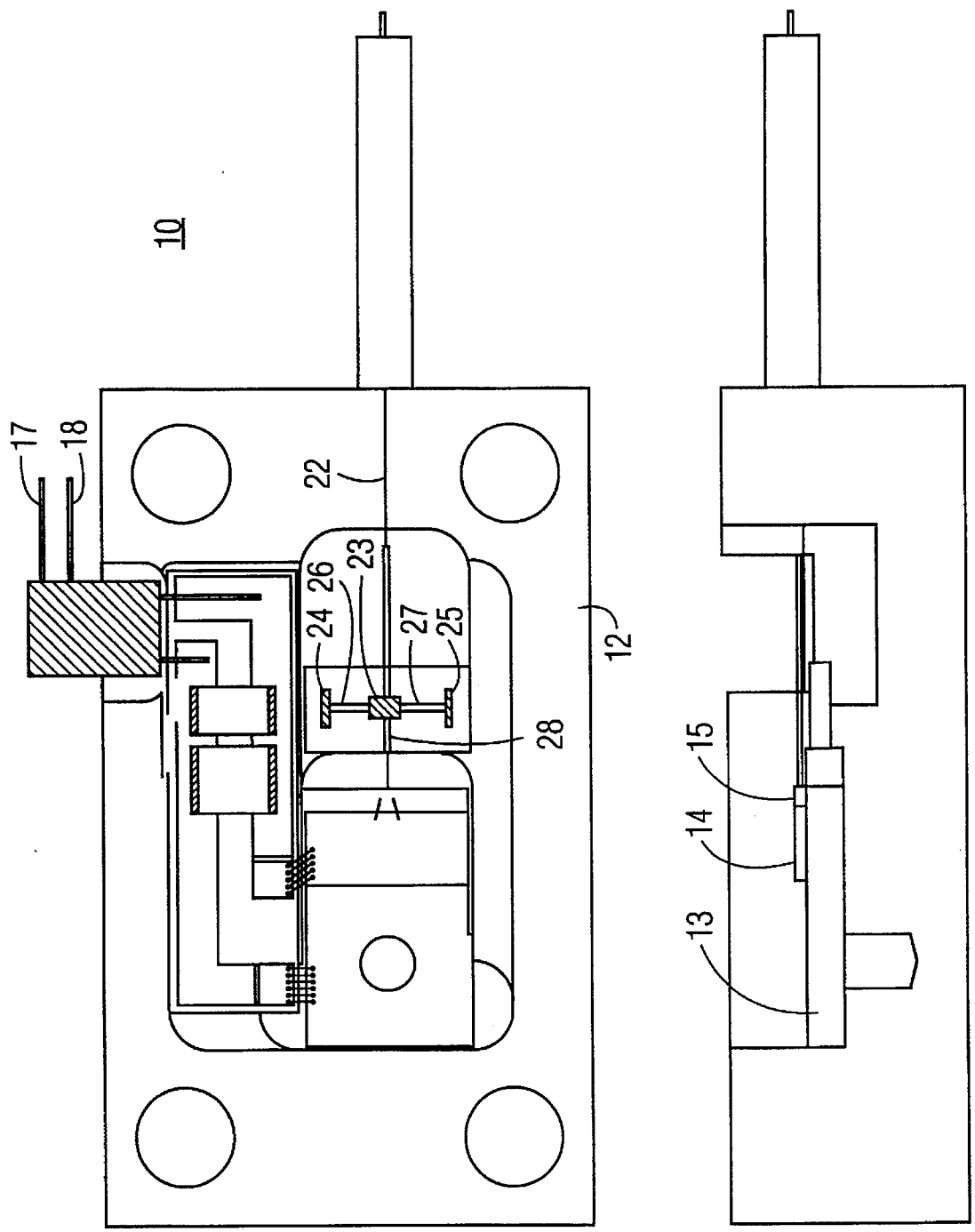
FIG. 1 is a schematic top view of a laser device showing a laser with an optical fiber in position.
FIG. 2 is an enlarged schematic side view of the device of FIG. 1.

FIG. 1 shows a schematic top view of a laser device 10 in accordance with the principles of this invention. The device includes the usual laser enclosure 12, a heat sink 13, a laser stand off 14 and a laser 15. The device also includes positive and negative electrical connections 17 and 18, respectively, to the laser and an entrance for an optical fiber into the laser enclosure.

The optical fiber 22 is secured to the laser device at 23 in FIG. 1. The present invention is directed at the (glass) optical fiber-to-laser device connection and the method of making that connection. Specifically, a solder hybrid is placed at 23 in the figure. The hybrid comprises two outer electrical contacts 24 and 25 across which a DC voltage is impressed under operator control. The two contacts are connected by two ten ohm resistors, 26 and 27, to the sides of a solder contact pad 28. The contact pad is composed of platinum, palladium and silver.

The optical fiber is positioned above the hybrid at the solder contact pad and a solder preform is positioned over the fiber. The solder preform is composed of indium, lead and silver 80/15/5 by weight and is in the shape of an arch thirty mils in width, with an inside diameter of thirty three mils and an outer diameter of sixty six mils. The hybrid and preform are separated from the laser output by about sixty mils and the fiber is separated from the hybrid by about twelve mils.

The solder preform arch is placed over the optical fiber making contact with the solder contact pad on the hybrid to either side of the fiber. A current flows through the resistors when a voltage is impressed across the electrical contacts thus heating the contact pad and melting the solder preform. The solder has a melting point of one hundred and forty seven degrees centigrade and flows to surround the fiber filling the space between the fiber and the solder contact pad on the hybrid.

The heat sink is bonded to the enclosure with an gold/tin (80/20) solder at 30 in FIG. 2.

Figure 3:
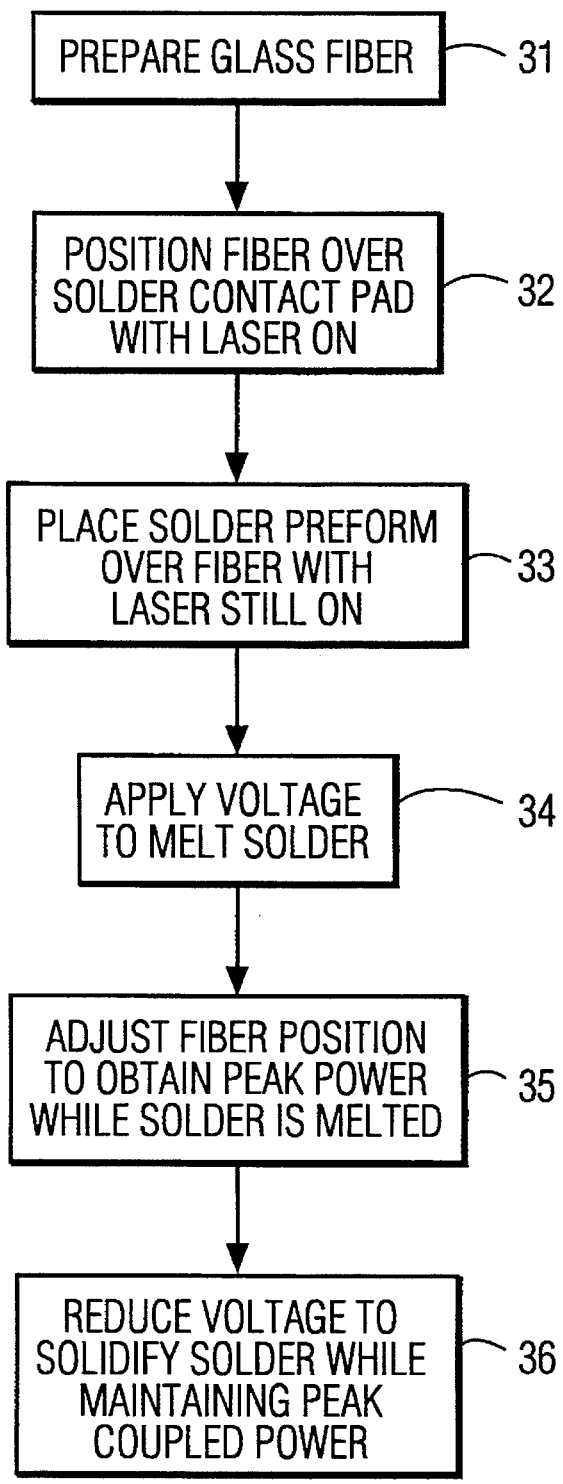
FIG. 3 is a flow diagram of the steps of the method for attaching an optical fiber to a laser according to the principles of this invention.

FIG. 3 shows a flow diagram of the method of securing a glass optical fiber to a laser device in accordance with the principles of this invention: First, the bare glass fiber is prepared with acetone followed by a methanol rinse to clean the fiber end for positioning in the laser enclosure. This step is represented by block 31 in FIG. 3. Next, the fiber is positioned by conventional techniques to maximize the light energy coupled into the fiber from the laser. This step is carried out with the laser turned on as indicated in block 32. With the laser still on, the solder preform is placed over the fiber as indicated in block 33 and the current through the resistors is increased until the solder melts as indicated in block 34. The coupled light (power) from the laser is maximized, while the solder is still in the melted state, by adjusting the position of the fiber by conventional techniques, as indicated by block 35. The final step is to decrease the current while final position adjustments are made for maintaining peak coupled power. The final step is indicated by block 36 in FIG. 3.

What is claimed is:

1. A laser device including a semiconductor laser chip for generating light at an output position, said device also including a glass optical fiber having first and second ends, said device also including means for securing said first end at said output position, said means for securing including a solder an indium containing solder adhering directly to said optical fiber adjacent said first end in the absence of any metallized layer on said fiber.

2. A laser device as set forth in claim 1 wherein said laser is a multimode laser and said fiber is a multimode fiber.

3. A laser device including a semiconductor laser chip for generating light at an output position, said device also including a glass optical fiber having first and second ends, said device also including means for securing said first end at said output position, said means for securing including solder adhering directly to said optical fiber adjacent said first end in the absence of any metallized layer on said fiber wherein said solder is composed of indium, lead, and silver 80/15/5 by weight.

4. A laser device as set forth in claim 3 wherein said means for securing includes a solder hybrid positioned beneath said fiber said hybrid including first and second electrical contacts for impressing a voltage therebetween, said contacts being connected by first and second resistors, said resistors being connected by a solder contact pad therebetween.

5. A laser device as set forth in claim 4 wherein said means for securing also comprises a solder preform positioned over said fiber and contacting said solder contact pad of said hybrid.

6. A laser device as set forth in claim 5 wherein said solder preform is in the shape of an arch and said hybrid and said preform are spaced apart from said laser to permit the end of said optical fiber to extend therebeyond.

7. A laser device as set forth in claim 6 wherein said solder preform has an inside diameter of thirty three mils and an outer diameter of sixty six mils.

8. A laser device as set forth in claim 7 wherein said solder preform is composed of indium, lead and silver 80/15/5 by weight.

9. A laser device as set forth in claim 8 wherein said laser generates multimode light energy and said fiber is a multimode fiber.

10. A method for securing a non-metallized optical fiber in a laser device for peak light energy coupling from a laser, said method comprising the steps of positioning said fiber over a solder hybrid and placing a solder preform over said fiber in a position corresponding to that of said hybrid adjacent a first end of said fiber, said hybrid including voltage responsive means for heating said solder preform to the melted state, extending said fiber beyond the position of said hybrid and preform and positioning said fiber for peak light energy coupling into said fiber while said preform is in the melted state and solidifying said preform.

11. A method as set forth in claim 10 wherein said hybrid includes first and second resistors with a solder contact therebetween and said voltage responsive means for heating includes said resistors, said voltage heating said resistors for melting said preform.

\* \* \* \* \*